(12) United States Patent
An

(10) Patent No.: US 10,394,097 B2
(45) Date of Patent: Aug. 27, 2019

(54) ARRAY SUBSTRATE AND DISPLAY PANEL

(71) Applicant: Shenzhen China Star Optoelectronics Technology Co., Ltd., Shenzhen, Guangdong (CN)

(72) Inventor: Liyang An, Guangdong (CN)

(73) Assignee: Shenzhen China Star Optoelectronics Technology Co., Ltd, Shenzhen, Guandong (CN)

( * ) Notice: Subject to any disclaimer, the term of this patent is extended or adjusted under 35 U.S.C. 154(b) by 0 days.

(21) Appl. No.: 15/736,315

(22) PCT Filed: Nov. 8, 2017

(86) PCT No.: PCT/CN2017/110002
§ 371 (c)(1),
(2) Date: Dec. 14, 2017

(87) PCT Pub. No.: WO2019/051971
PCT Pub. Date: Mar. 21, 2019

(65) Prior Publication Data
US 2019/0086746 A1  Mar. 21, 2019

(30) Foreign Application Priority Data
Sep. 18, 2017 (CN) .......................... 2017 1 0848747

(51) Int. Cl.
*G02F 1/1362* (2006.01)
*H01L 27/12* (2006.01)
(Continued)

(52) U.S. Cl.
CPC ...... *G02F 1/136213* (2013.01); *G02F 1/1368* (2013.01); *G02F 1/134309* (2013.01); *G02F 1/136209* (2013.01); *H01L 27/124* (2013.01); *H01L 27/1255* (2013.01); *H01L 28/60* (2013.01); *H01L 29/78633* (2013.01); *G02F 1/13439* (2013.01); *G02F 2001/133397* (2013.01); *G02F 2001/134345* (2013.01); *G02F 2201/121* (2013.01); *G02F 2201/123* (2013.01)

(58) Field of Classification Search
CPC ......... G02F 1/134309; G02F 1/136213; G02F 1/136209; H01L 27/124; H01L 27/1255; H01L 29/78633
See application file for complete search history.

(56) References Cited

U.S. PATENT DOCUMENTS

2008/0225190 A1* 9/2008 Chen ................. G02F 1/136213
349/38

* cited by examiner

*Primary Examiner* — Bilkis Jahan
*Assistant Examiner* — Victor V Barzykin
(74) *Attorney, Agent, or Firm* — Andrew C. Cheng

(57) ABSTRACT

An array substrate includes a plurality of pixel units arranged in an array. Each of the pixel units includes a common electrode, a first insulation layer, a sub pixel electrode, a second insulation layer, and a conductor plate that are sequentially stacked. The conductor plate is electrically connected to the common electrode. The common electrode and the sub pixel electrode collectively form therebetween a first confronting area and the conductor plate and the sub pixel electrode collectively form therebetween a second confronting area, such that a storage capacitor is formed, collectively, between the common electrode and the sub pixel electrode and between the conductor plate and the sub pixel electrode. The above-described array substrate provides a relatively large storage capacitor. Also disclosed is a display panel.

16 Claims, 9 Drawing Sheets

(51) Int. Cl.
*H01L 49/02* (2006.01)
*H01L 29/786* (2006.01)
*G02F 1/1343* (2006.01)
*G02F 1/1368* (2006.01)
*G02F 1/1333* (2006.01)

ARRAY SUBSTRATE AND DISPLAY PANEL

CROSS REFERENCE TO RELATED APPLICATIONS

This application claims the priority of Chinese Patent Application No. 201710848747.6 filed on Sep. 18, 2017, titled "Array Substrate and Display Panel", the disclosure of which is incorporated herein by reference in its entirety.

BACKGROUND OF THE INVENTION

1. Field of the Invention

The present invention relates to the field of display technology, and more particularly to an array substrate and a display panel.

2. The Related Arts

The liquid crystal display panel industry has been developed for decades. The vertical alignment (VA) display mode is a common display mode of thin-film transistor liquid crystal displays (TFT-LCDs) for large-scale televisions due to advantages including wide view angle, high contrast, and requiring no rubbing alignment.

A structure of a pixel of an LCD is generally made up of a TFT device, several capacitors, and signal lines, in which a storage capacitor (Cst) functions to reduce the kickback voltage $\Delta V$ of the pixel to maintain steady of the voltage between two ends of liquid crystal. Generally, the kickback voltage $\Delta V=(Voff-Von) \times Cgs/Ctotal$, wherein Voff and Von are off voltage and on voltage of a scan line, Ctotal is other capacitance of the pixel electrode and generally comprising three capacitances, namely Ctotal=Cgs (parasitic capacitance of the TFT)+Cst (storage capacitance)+Clc (liquid crystal capacitance). It can be seen from the formula that the larger the storage capacitance is, the smaller the value of the kickback voltage will be. It is a challenge of this industry to increase the storage capacitance in order to reduce the kickback voltage.

SUMMARY OF THE INVENTION

The present invention provides an array substrate and a display panel having a relatively large storage capacitor.

Embodiments of the present invention adopt the following technical solutions:

In one aspect, an array substrate is provided, comprising a plurality of pixel units arranged in an array, each of the pixel units comprising a common electrode, a first insulation layer, a sub pixel electrode, a second insulation layer, and a conductor plate that are sequentially stacked, the conductor plate being electrically connected to the common electrode, wherein the common electrode and the sub pixel electrode collectively form a first confronting area therebetween and the conductor plate and the sub pixel electrode collectively form a second confronting area therebetween such that a storage capacitor is formed, collectively, between the common electrode and the sub pixel electrode and between the conductor plate and the sub pixel electrode.

In the above array substrate, the first insulation layer is formed with a first through hole to expose a portion of the common electrode, the sub pixel electrode and the first through hole being separated from each other, the second insulation layer being formed with a second through hole connected to and in communication with the first through hole, the conductor plate being connected, through the second through hole and the first through hole, to the common electrode.

In the above array substrate, each of the pixel units comprises a thin-film transistor, the thin-film transistor having a source electrode and a drain electrode that are arranged on the same layer as the sub pixel electrode, the drain electrode being connected to the sub pixel electrode.

In the above array substrate, the thin-film transistor has a gate electrode arranged on the same layer as the common electrode.

In the above array substrate, each of the pixel units comprises a light-transmitting area and a light-shielding area arranged on a periphery of the light-transmitting area, the sub pixel electrode being located in the light-shielding area, the array substrate further comprising a main pixel electrode located in the light-transmitting area, the main pixel electrode being electrically connected to the sub pixel electrode.

In the above array substrate, the second insulation layer is formed with a third through hole to expose a portion of the sub pixel electrode, the main pixel electrode being connected, through the third through hole, to the sub pixel electrode.

In the above array substrate, the conductor plate and the main pixel electrode are arranged on the same layer and the conductor plate and the main pixel electrode are isolated from each other.

In the above array substrate, the conductor plate is made of a material that is the same as a material that makes the main pixel electrode.

In the above array substrate, the common electrode casts an orthogonal projection on the main pixel electrode, which is located in a peripheral area of the main pixel electrode.

In another aspect, a display panel is provided, comprising the above-described array substrate.

In the array substrate of an embodiment of the present invention, the sub pixel electrode functions as one electrode plate of the storage capacitor and the conductor plate and the common electrode collectively function as another one electrode plate of the storage capacitor. The common electrode and the sub pixel electrode form therebetween the first confronting area and the conductor plate and the sub pixel electrode form therebetween the second confronting area, so that the total confronting area of the storage capacitor is the sum of the first confronting area and the second confronting area. Since the capacitance of the storage capacitor is proportional to a confronting area between the two electrode plates thereof and since in the instant embodiment, the pixel units is additionally provided with the conductor plate, the total confronting area of the storage capacitor is increased by at least the second confronting area as compared to the prior art so that the pixel unit can significantly increase the capacitance of the storage capacitor. The increased capacitance of the storage capacitor of the array substrate and the display panel 100 improves the homogeneity of displaying of the display panel and effectively reduce kickback voltage to prevent displaying abnormalities, such as image sticking.

BRIEF DESCRIPTION OF THE DRAWINGS

To more clearly explain the technical solution of the present invention, a brief description of the drawings that are necessary for embodiments of the present invention is given as follows. It is obvious that the drawings that will be described below show only some embodiments of the present invention. For those having ordinary skills of the art.

DETAILED DESCRIPTION OF THE PREFERRED EMBODIMENTS

Figure 1:
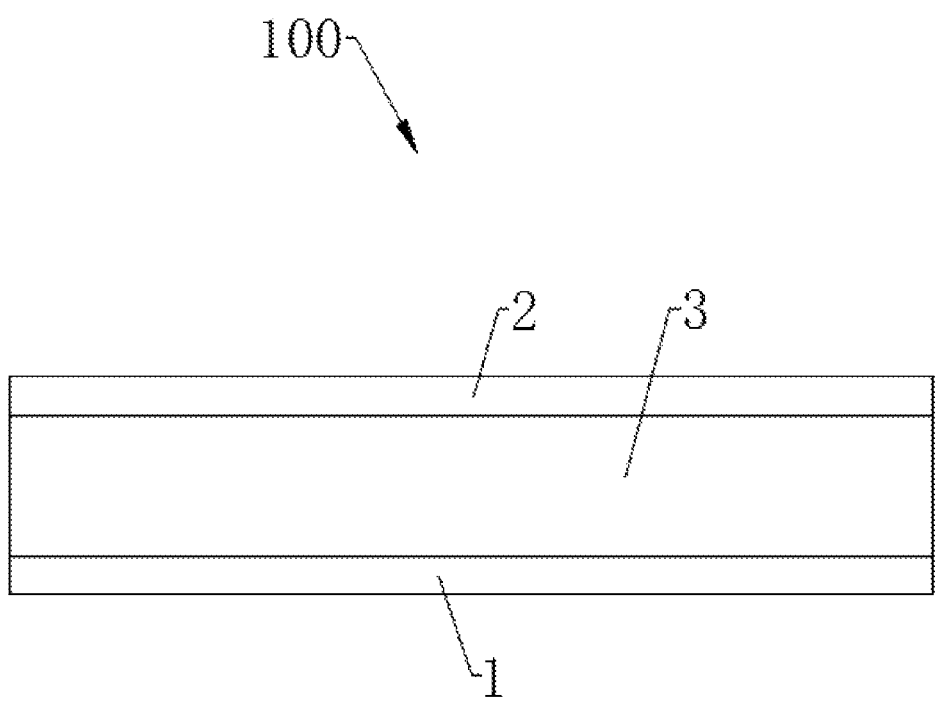
FIG. 1 is a schematic view illustrating a structure of a display panel provided in an embodiment of the present invention.
Figure 2:
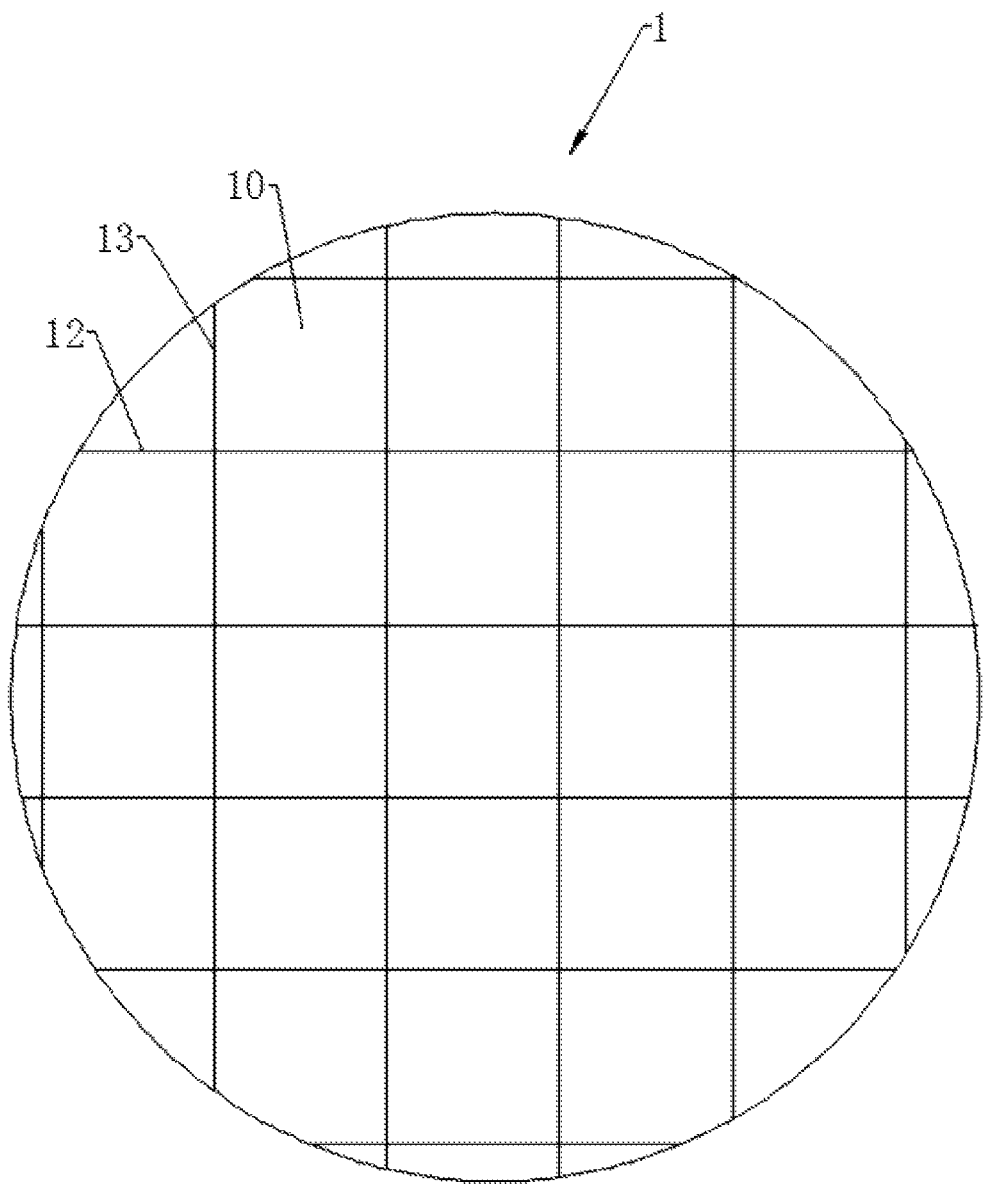
FIG. 2 is a schematic view illustrating a structure of an array substrate of the display panel shown in FIG. 1.

A description will be given to technical solutions provided by embodiments of the present invention with reference to the attached drawings of the embodiments of the present invention. However, the embodiments so described are only some, but not all, of the embodiments of the present invention. Other embodiments that are available to those having ordinary skills of the art based on the embodiment of the present invention, without the expense of creative effort and endeavor, are considered belonging to the scope of protection of the present invention.

In addition, the description given below for each embodiment is made with reference to the attached drawings to exemplify specific embodiments that the present invention may be put into practice. Direction related terminology used in the present invention, such as "up", "down", "front", "rear", "left", "right", "internal", "external", and "lateral", is provided as direction defined in the drawing sheets. Thus, using the direction related terminology, which is for better and more clearly describing and understanding of the present invention and is not for indicating or implying any specific orientation that a device or an element described must take or the device or element must be structured or operated at a specific orientation, should thus be appreciated as not imposing constraints to the present invention.

In the description of the present invention, it should be noted that unless specifically required and set, the terms "installation", "connection", "jointing", and "disposed on . . . " as used herein should be interpreted in a broad way, such as being fixedly connected or removably connected, or integrally connected; or being mechanically connected; or being directly connected, or indirectly connected with intervening media therebetween, or interiors of two element being in communication with each other. For those having ordinary skills in the art, the specific meaning of these terms used in the present invention can be appreciated for any actual situations.

Further, in the description of the present invention, unless stated otherwise, "multiple" means two or more than two. Terms related to "operations", if used in this specification, should means independent operations and for cases where distinction from other operations, any operation that achieve a desired effect of the operation is included in the terms so used. Further, the symbol "-" as used in this specification stands for a numeral range, which comprises a range of which the minimum and the maximum are respectively the figures set in front of and behind "-". In the drawings, units having similar or the same structure are designated with the same reference numerals.

Referring collectively to FIGS. 1-6, the present invention provides, in an embodiment, a display panel 100. The display panel 100 comprises an array substrate 1. The display panel 100 is applicable to various display devices, such as a mobile phone, a television, and a computer. The display panel 100 further comprises a color filter (CF) substrate 2 that is opposite to the array substrate 1 and a liquid crystal (LC) layer 3 located between the array substrate 1 and the color filter substrate 2.

The array substrate 1 comprises a plurality of pixel units 10 arranged in an array. The array substrate 1 comprises a backing 11 and multiple gate lines 12 and multiple data lines 13 formed on the backing 11. The multiple gate lines 12 and the multiple data lines 13 intersect each other to circumferentially enclose and delimit a plurality of pixel units 10.

Each of the pixel units 10 comprises, stacked in sequence on the backing 11, a common electrode 14, a first insulation layer 15, a sub pixel electrode 16, a second insulation layer 17, and a conductor plate 18. The first insulation layer 15 isolates the common electrode 14 and the sub pixel electrode 16 from each other. The second insulation layer 17 isolates the sub pixel electrode 16 and the conductor plate 18 from each other. The conductor plate 18 is electrically connected to the common electrode 14, so that the conductor plate 18 and the common electrode 14 have identical voltages. The common electrode 14 and the sub pixel electrode 16 form therebetween a first confronting area S1, and the conductor plate 18 and the sub pixel electrode 16 form therebetween a second confronting area S2, so that a storage capacitor is formed, collectively, between the common electrode 14 and the sub pixel electrode 16 and between the conductor plate 18 and the sub pixel electrode 16.

In the instant embodiment, the sub pixel electrode 16 functions as one electrode plate of the storage capacitor and the conductor plate 18 and the common electrode 14 collectively function as another one electrode plate of the storage capacitor. The common electrode 14 and the sub pixel electrode 16 form therebetween the first confronting area S1 and the conductor plate 18 and the sub pixel electrode 16 form therebetween the second confronting area S2, so that the total confronting area S of the storage capacitor is the sum of the first confronting area S1 and the second confronting area S2 (S=S1+S2). Since the capacitance of the storage capacitor is proportional to a confronting area between the two electrode plates thereof and since in the instant embodiment, the pixel units 10 is additionally provided with the conductor plate 18, the total confronting area S of the storage capacitor is increased by at least the second confronting area S2 as compared to the prior art (wherein a prior art storage capacitor has a confronting area that includes only the confronting area between the common electrode and the sub pixel electrode) so that the pixel unit 10 can significantly increase the capacitance of the storage capacitor. The increased capacitance of the storage capacitor of the array substrate 1 and the display panel 100 improves the homogeneity of displaying of the display panel 100 and effectively reduce kickback voltage to prevent displaying abnormalities, such as image sticking.

Optionally, the first insulation layer 15 and the second insulation layer 17 are made of the same material in order to lower down cost. Of course, in other embodiments, the first insulation layer 15 and the second insulation layer 17 can alternatively be made of different materials.

Optionally, since the capacitance of the storage capacitor is inversely proportional to a spacing distance between the two electrode plates thereof, it is also possible to reduce a spacing distance between the common electrode 14 and the sub pixel electrode 16 and/or reduce the spacing distance between the sub pixel electrode 16 and the conductor plate 18 for increase of the capacitance of the storage capacitor. In other words, increasing the capacitance of the storage capacitor can be achieved with reduction of thickness of the first insulation layer 15 and/or that of the second insulation layer 17.

Optionally, the first insulation layer 15 is formed with a first through hole 151 to expose a portion of the common electrode 14. The sub pixel electrode 16 and the first through hole 151 are spaced from each other, meaning there is no overlapping present between the sub pixel electrode 16 and the first through hole 151 and the sub pixel electrode 16 is arranged to circle around the first through hole 151. The second insulation layer 17 is formed with a second through hole 171 connected to and in communication with the first through hole 151. The second through hole 171 is arranged to exact correspond to the first through hole 151. The conductor plate 18 is connected, through the second through hole 171 and the first through hole 151, to the common electrode 14, so that the conductor plate 18 and the common electrode 14 may be of the same potential to thereby collectively serve as one electrode plate of the storage capacitor.

Optionally, each of the pixel units 10 comprises a thin-film transistor 20. The thin-film transistor 20 has a source electrode 21 and a drain electrode 22 that are arranged in the same layer as the sub pixel electrode 16. The drain electrode 22 is connected to the sub pixel electrode 16. The source electrode 21 is connected to the data line 13.

Optionally, the thin-film transistor 20 has a gate electrode 23 that is arranged on the same layer as the common electrode 14. The gate electrode 23 is connected to the gate line 12.

Referring collectively to FIGS. 3-8, as an optional embodiment, each of the pixel units 10 may comprise a light-transmitting area 101 (which is also referred to as an opening area) and a light-shielding area 102 arranged on a periphery of the light-transmitting area 101. The light-shielding area 102 is shielded by a non-light-transmitting metal electrode (such as the gate lines 12, the data lines 13, and the common electrode 14) or can be shielded by a black matrix (BM) provided on the color filter substrate 2. The sub pixel electrode 16 is located in the light-shielding area 102. The array substrate 1 further comprises a main pixel electrode 19 located in the light-transmitting area 101 and the main pixel electrode 19 is electrically connected to the sub pixel electrode 16.

The conductor plate 18 is arranged in the light-shielding area 102. The conductor plate 18 is arranged exactly opposite to the sub pixel electrode 16 in order to make the second confronting area S2 as large as possible. In this application, since the conductor plate 18 is arranged in the light-shielding area 102, the capacitance of the storage capacitor can be effectively increased without loss of aperture ratio of the array substrate 1 and the display panel 100.

The common electrode 14 is a metallic electrode made of a non-light-transmitting material. The common electrode 14 casts an orthogonal projection on the backing 11 that covers an orthogonal projection cast on the backing 11 by the sub pixel electrode 16. Under such a condition, the sub pixel electrode 16 has an area that is the first confronting area S1.

Optionally, the second insulation layer 17 is formed with a third through hole 172 to expose a portion of the sub pixel electrode 16. The main pixel electrode 19 is connected, through the third through hole 172, to the sub pixel electrode 16.

Optionally, the conductor plate 18 and the main pixel electrode 19 are arranged on the same layer and the conductor plate 18 and the main pixel electrode 19 are insulatively isolated from each other.

The conductor plate 18 is made of a material that is identical to a material that makes the main pixel electrode 19. Under such a condition, the conductor plate 18 and the main pixel electrode 19 can be formed through the same etching process to thereby simplify the fabrication operation of the array substrate 1 and lower down the costs of the array substrate 1 and the display panel 100.

The conductor plate 18 and the main pixel electrode 19 may use a material comprising indium tin oxide (ITO) or other transparent conductive materials.

Of course, in other embodiments, the conductor plate 18 can be made of a material that is different from a material that makes the main pixel electrode 19 and the material of the conductor plate 18 and the material of the main pixel electrode 19 can be set according to actual requirements.

Figure 3:
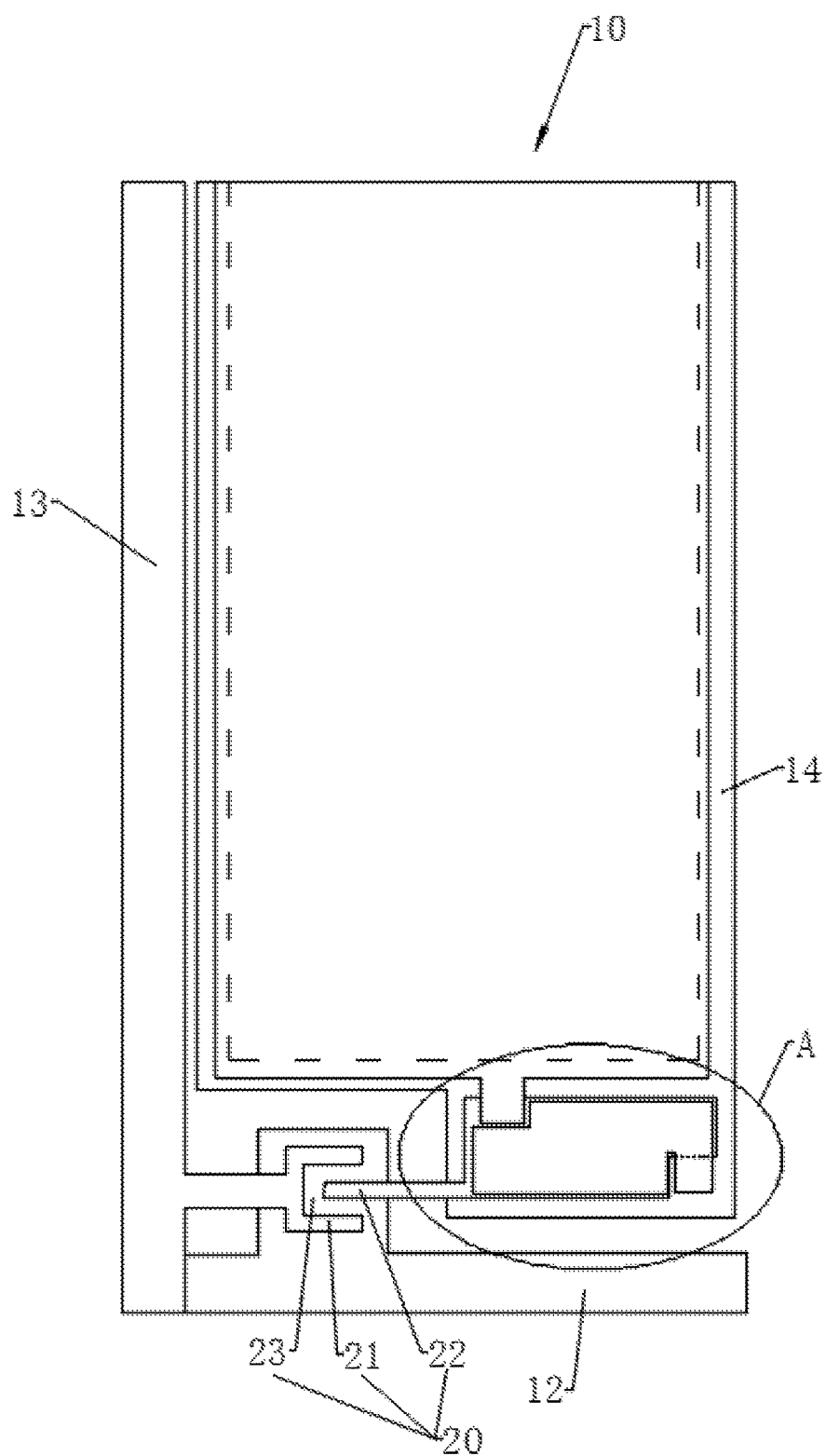
FIG. 3 is a schematic view illustrating a structure of a pixel unit of the array substrate shown in FIG. 2.
Figure 4:
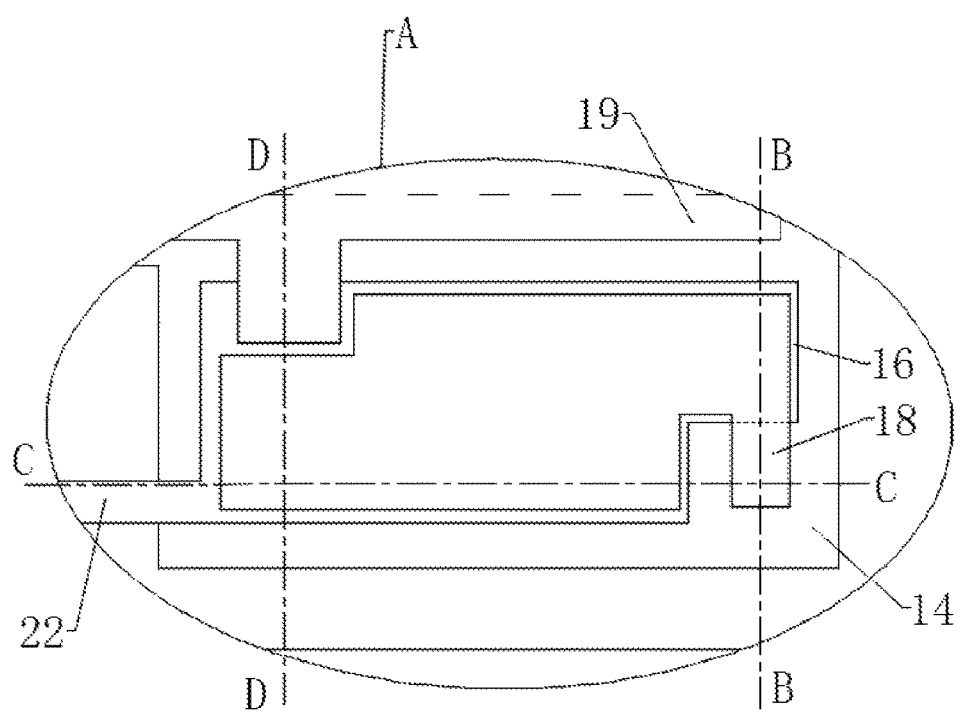
FIG. 4 is a schematic view, in an enlarged form, illustrating a structure of portion "A" of the pixel unit shown in FIG. 3.
Figure 5:
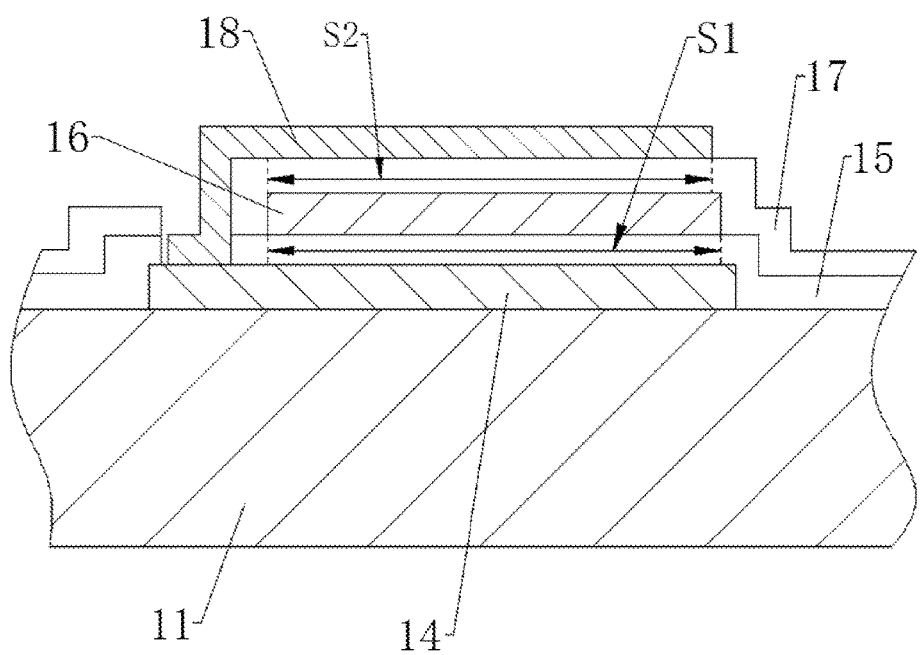
FIG. 5 is a schematic view illustrating a structure of a section taken along line B-B of FIG. 4.
Figure 6:
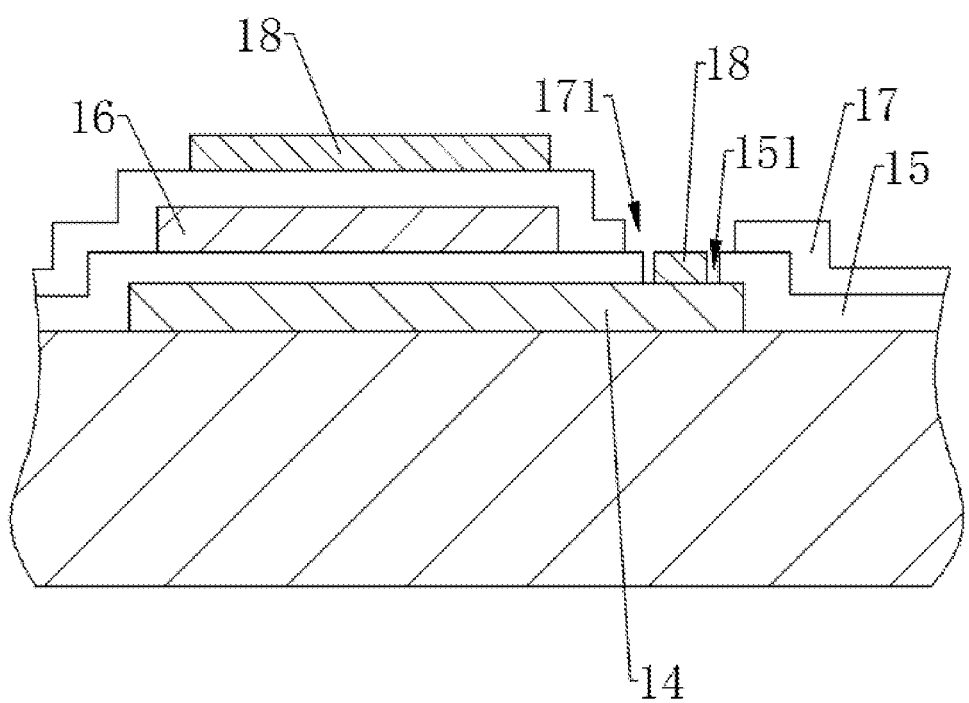
FIG. 6 is a schematic view illustrating a structure of a section taken along line C-C of FIG. 4.
Figure 7:
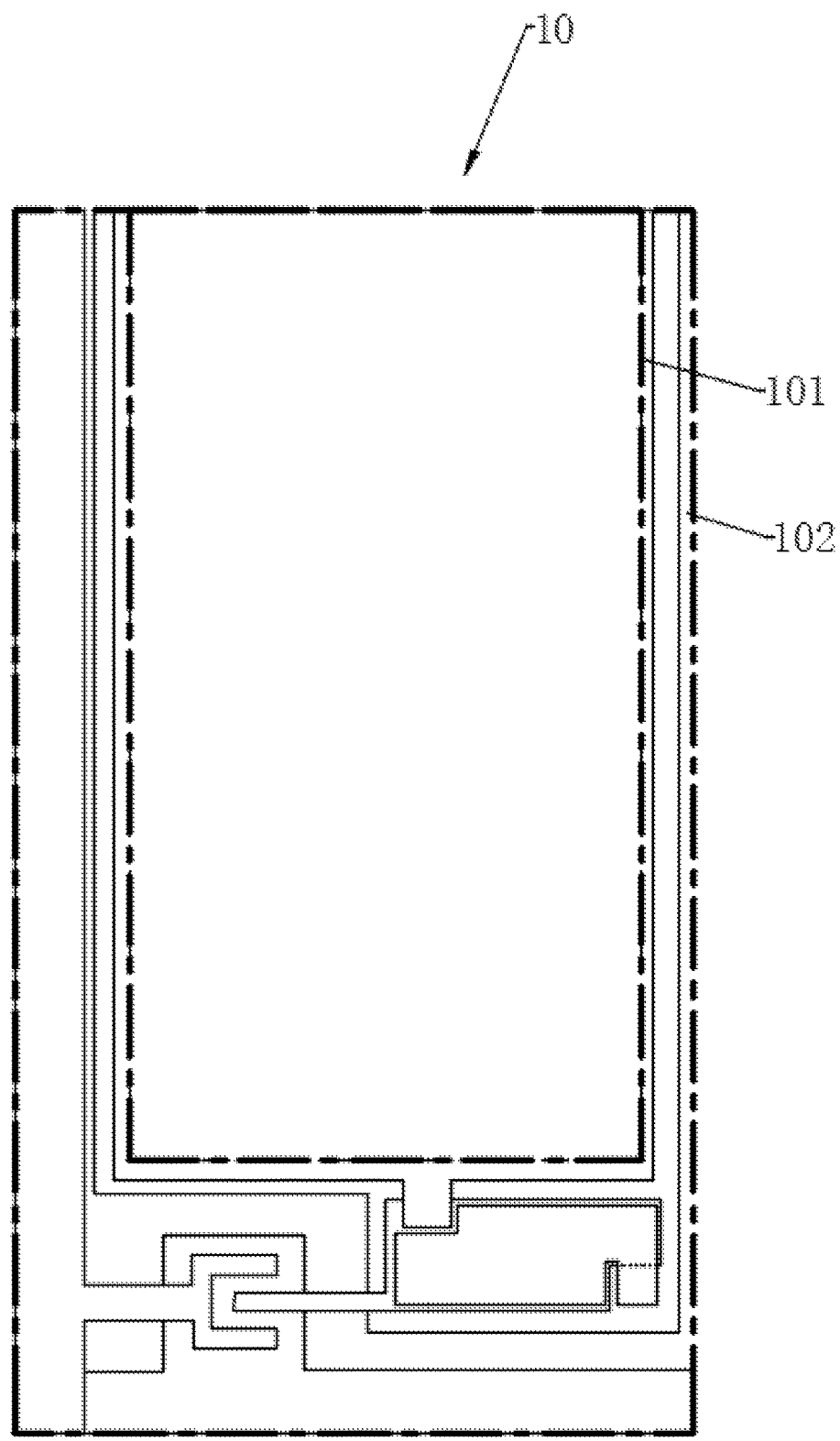
FIG. 7 is another schematic view illustrating the pixel unit shown in FIG. 3.
Figure 8:
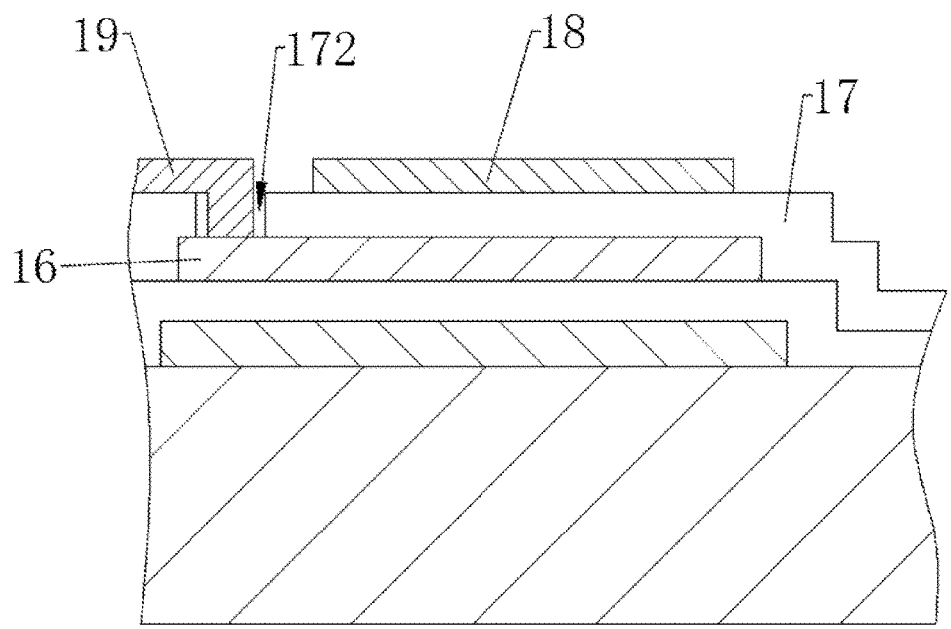
FIG. 8 is a schematic view illustrating a structure of a section taken along line D_D of FIG. 4.
Figure 9:
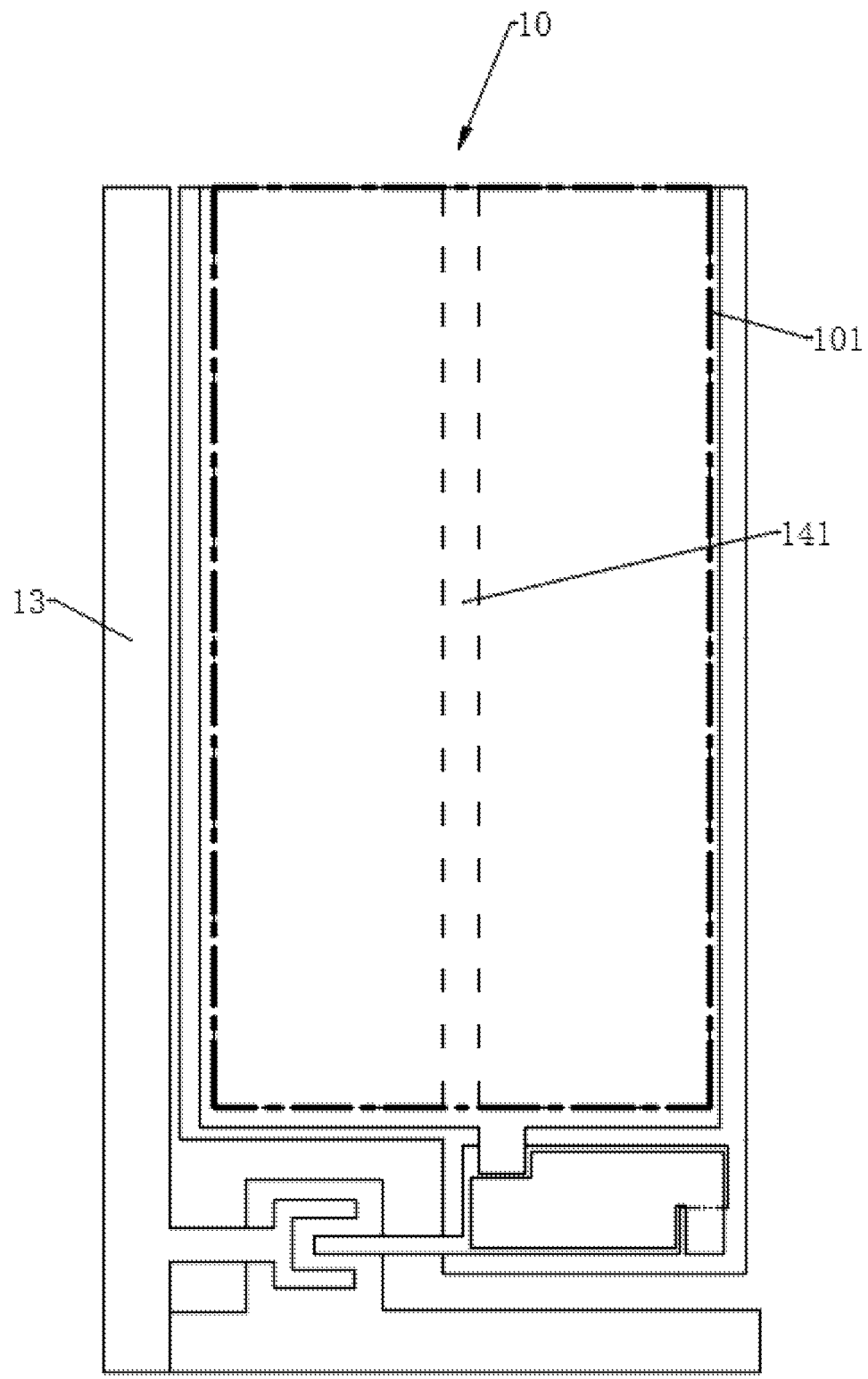
FIG. 9 is a schematic view illustrating a structure of another pixel unit of the array substrate shown in FIG. 2.

Referring collectively to FIGS. 3, 7, and 9, as an optional embodiment, the common electrode 14 casts an orthogonal projection on the main pixel electrode 19 that is located in a peripheral area of the main pixel electrode 19. The main pixel electrode 19 has a central area that is surrounded by the peripheral area of the main pixel electrode 19. The central area of the central area of the main pixel electrode 19 has a surface area that is greater than that of the peripheral area of the main pixel electrode 19. The central area of the main pixel electrode 19 is located in the light-transmitting area 101, while the peripheral area of the main pixel electrode 19 overlaps the common electrode 14 and is located in the light-shielding area 102. Under such a condition, the light-transmitting area 101 is not provided therein with wiring of the common electrode 14.

In the prior art, it is common to arrange wires of the common electrode in the light-transmitting area of a pixel unit and the wires are intersecting wires that are perpendicular to each other so that it is easy to form a slope of 45° in an intersection site after an etching operation to thereby affect light transmission of the liquid crystal molecules contained in the liquid crystal layer, leading to light leaking in a dark state of the display panel and resulting in a low contrast of the display panel.

The instant embodiment is structured such that no wiring of the common electrode is provided in the light-transmitting area 101 so as to prevent light leaking in the dark state resulting from poor etching operation, and thus, the display panel 100 may demonstrate bettered displaying performance.

Of course, in other embodiments, it is also possible to provide one single wire 141 in the light-transmitting area 101, such as a wire that is parallel to the data lines 13 (as shown in FIG. 9) or the gate lines 12. Under this condition, since the single wire does not form an intersection site in the light-transmitting area 101, light leaking in the dark state resulting from a poor etching operation can be avoided, so that the display panel 100 may demonstrate bettered displaying performance.

The above provides a detailed description of embodiments of the present invention. Specific examples are used in the specification to expound the principle and embodying ways of the present invention. The description of the embodiments is provided to help understanding of the method of the present invention, as well as the essential idea thereof. Further, for those having ordinary skills in the art, it can be contemplated to make modifications, based on the idea of the present invention, on the embodiments and applications thereof. In conclusion, the specification should not be interpreted as constraints to the scope of the present invention.

What is claimed is:

1. An array substrate, comprising a plurality of pixel units arranged in an array, each of the pixel units comprising a common electrode, a first insulation layer, a sub pixel electrode, a second insulation layer, and a conductor plate that are sequentially stacked, the conductor plate being electrically connected to the common electrode, wherein the common electrode and the sub pixel electrode collectively form a first confronting area therebetween and the conductor plate and the sub pixel electrode collectively form a second confronting area therebetween such that a storage capacitor is formed, collectively, between the common electrode and the sub pixel electrode and between the conductor plate and the sub pixel electrode;

wherein each of the pixel units comprises a light-transmitting area and a light-shielding area arranged on a periphery of the light-transmitting area, the sub pixel electrode being located in the light-shielding area, the array substrate further comprising a main pixel electrode located in the light-transmitting area, the main pixel electrode being electrically connected to the sub pixel electrode.

2. The array substrate according to claim 1, wherein the first insulation layer is formed with a first through hole to expose a portion of the common electrode, the sub pixel electrode and the first through hole being separated from each other, the second insulation layer being formed with a second through hole connected to and in communication with the first through hole, the conductor plate being connected, through the second through hole and the first through hole, to the common electrode.

3. The array substrate according to claim 1, wherein each of the pixel units comprises a thin-film transistor, the thin-film transistor having a source electrode and a drain electrode that are arranged on the same layer as the sub pixel electrode, the drain electrode being connected to the sub pixel electrode.

4. The array substrate according to claim 3, wherein the thin-film transistor has a gate electrode arranged on the same layer as the common electrode.

5. The array substrate according to claim 1, wherein the second insulation layer is formed with a third through hole to expose a portion of the sub pixel electrode, the main pixel electrode being connected, through the third through hole, to the sub pixel electrode.

6. The array substrate according to claim 1, wherein the conductor plate and the main pixel electrode are arranged on the same layer and the conductor plate and the main pixel electrode are isolated from each other.

7. The array substrate according to claim 6, wherein the conductor plate is made of a material that is the same as a material that makes the main pixel electrode.

8. The array substrate according to claim 1, wherein the common electrode casts an orthogonal projection on the main pixel electrode, which is located in a peripheral area of the main pixel electrode.

9. A display panel, comprising an array substrate, the array substrate comprising a plurality of pixel units, each of the pixel units comprising a common electrode, a first insulation layer, a sub pixel electrode, a second insulation layer, and a conductor plate that are sequentially stacked, the conductor plate being electrically connected to the common electrode, wherein the common electrode and the sub pixel electrode collectively form a first confronting area therebetween and the conductor plate and the sub pixel electrode collectively form a second confronting area therebetween such that a storage capacitor is formed, collectively, between the common electrode and the sub pixel electrode and between the conductor plate and the sub pixel electrode;

wherein each of the pixel units comprises a light-transmitting area and a light-shielding area arranged on a periphery of the light-transmitting area, the sub pixel electrode being located in the light-shielding area, the array substrate further comprising a main pixel electrode located in the light-transmitting area, the main pixel electrode being electrically connected to the sub pixel electrode.

10. The display panel according to claim 9, wherein the first insulation layer is formed with a first through hole to expose a portion of the common electrode, the sub pixel electrode and the first through hole being separated from each other, the second insulation layer being formed with a second through hole connected to and in communication with the first through hole, the conductor plate being connected, through the second through hole and the first through hole, to the common electrode.

11. The display panel according to claim 9, wherein each of the pixel units comprises a thin-film transistor, the thin-film transistor having a source electrode and a drain electrode that are arranged on the same layer as the sub pixel electrode, the drain electrode being connected to the sub pixel electrode.

12. The display panel according to claim 11, wherein the thin-film transistor has a gate electrode arranged on the same layer as the common electrode.

13. The display panel according to claim 9, wherein the second insulation layer is formed with a third through hole to expose a portion of the sub pixel electrode, the main pixel electrode being connected, through the third through hole, to the sub pixel electrode.

14. The display panel according to claim 9, wherein the conductor plate and the main pixel electrode are arranged on the same layer and the conductor plate and the main pixel electrode are isolated from each other.

15. The display panel according to claim 14, wherein the conductor plate is made of a material that is the same as a material that makes the main pixel electrode.

16. The display panel according to claim 9, wherein the common electrode casts an orthogonal projection on the main pixel electrode, which is located in a peripheral area of the main pixel electrode.

* * * * *